(12) United States Patent
Daubenspeck et al.

(10) Patent No.: US 7,323,780 B2
(45) Date of Patent: Jan. 29, 2008

(54) ELECTRICAL INTERCONNECTION STRUCTURE FORMATION

(75) Inventors: Timothy H. Daubenspeck, Colchester, VT (US); Jeffrey P. Gambino, Westford, VT (US); Christopher D. Muzzy, Burlington, VT (US); Wolfgang Sauter, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 223 days.

(21) Appl. No.: 11/164,107

(22) Filed: Nov. 10, 2005

(65) Prior Publication Data

US 2007/0105359 A1    May 10, 2007

(51) Int. Cl.
*H01L 23/52* (2006.01)
*H01L 23/44* (2006.01)

(52) U.S. Cl. .............. 257/738; 257/781; 257/E23.021; 257/E23.069; 257/E21.508; 438/614

(58) Field of Classification Search ........ 438/613–614; 257/737–738, 780–781, E23.021, E23.069, 257/E21.508
See application file for complete search history.

(56) References Cited

U.S. PATENT DOCUMENTS

| | | | |
|---|---|---|---|
| 5,767,010 A * | 6/1998 | Mis et al. .................. | 438/614 |
| 6,333,559 B1 | 12/2001 | Costrini et al. | |
| 6,346,469 B1 | 2/2002 | Greer | |
| 6,350,668 B1 * | 2/2002 | Chakravorty .............. | 438/612 |
| 6,372,622 B1 * | 4/2002 | Tan et al. .................. | 438/612 |
| 6,426,557 B1 | 7/2002 | Daubenspeck et al. | |
| 6,437,440 B1 | 8/2002 | Cabral, Jr. et al. | |
| 6,610,595 B2 | 8/2003 | Seshan | |
| 6,689,678 B2 | 2/2004 | James et al. | |
| 6,930,032 B2 * | 8/2005 | Sarihan et al. ........... | 438/614 |
| 2002/0090804 A1 | 7/2002 | McTeer | |
| 2003/0092254 A1 | 5/2003 | Walker et al. | |
| 2003/0129821 A1 * | 7/2003 | Weng ........................ | 438/612 |
| 2004/0159944 A1 | 8/2004 | Datta et al. | |
| 2004/0166661 A1 * | 8/2004 | Lei ............................ | 438/614 |
| 2004/0185649 A1 * | 9/2004 | Huang et al. ............. | 438/612 |
| 2004/0234679 A1 | 11/2004 | Edelstein et al. | |
| 2005/0009317 A1 * | 1/2005 | Lin ........................... | 438/613 |
| 2005/0116340 A1 * | 6/2005 | Shindo ...................... | 257/737 |
| 2007/0087544 A1 * | 4/2007 | Chang et al. ............. | 438/612 |

\* cited by examiner

*Primary Examiner*—Zandra V. Smith
*Assistant Examiner*—Toniae M Thomas
(74) *Attorney, Agent, or Firm*—Schmeiser, Olsen & Watts; William D. Sabo (57) ABSTRACT

An electrical interconnection structure and method for forming. The electrical structure comprises a substrate comprising electrically conductive pads and a first dielectric layer over the substrate and the electrically conductive pads. The first dielectric layer comprises vias. A metallic layer is formed over the first dielectric layer and within the vias. A second dielectric layer is formed over the metallic layer. A ball limiting metallization layer is formed within the vias. A photoresist layer is formed over a surface of the ball limiting metallization layer. A first solder ball is formed within a first opening in the photoresist layer and a second solder ball is formed within a second opening in the photoresist layer.

11 Claims, 7 Drawing Sheets

ELECTRICAL INTERCONNECTION STRUCTURE FORMATION

BACKGROUND OF THE INVENTION

1. Technical Field

The present invention relates to an electrical connection structure and associated forming method.

2. Related Art

An electrical structure connected to another electrical structure may not comprise a structurally adequate connection. Therefore there exists a need for a means for connecting an electrical structure to another electrical structure comprising a structurally adequate connection.

SUMMARY OF THE INVENTION

The present invention provides a method for forming an electrical structure, comprising:

providing a substrate comprising a first electrically conductive pad and a second electrically conductive pad formed within a volumetric portion of the substrate and a first dielectric layer over a surface of said substrate, a surface of said first electrically conductive pad, and a surface of said second electrically conductive pad;

forming a first via and a second via in said first dielectric layer, said first via located over a portion of said surface of said first electrically conductive pad, said second via located over a portion of said surface of said second electrically conductive pad;

forming a metallic layer over a surface of said first dielectric layer and within said first via and said second via;

forming a second dielectric layer over a surface of said metallic layer;

removing a first portion, a second portion, and a third portion of said second dielectric layer, said first portion removed from over and within said first via, said second portion removed from over and within said second via, and said third portion removed from between said first via and said second via;

forming a ball limiting metallization layer within said first via and said second via, over a portion of said surface of said metallic layer, and over a surface of said second dielectric layer that remains after said removing said first portion, said second portion, and said third portion of said second dielectric layer;

forming a photoresist layer over a surface of said ball limiting metallization layer;

forming a first opening in said photoresist layer by removing a first portion of said photoresist layer located within and over said first via and extending laterally over and parallel to a portion of said surface of said ball limiting metallization layer;

forming a second opening in said photoresist layer by removing a second portion of said photoresist layer located within and over said second via and extending laterally over and parallel to a portion of said surface of said ball limiting metallization layer; and forming a first solder structure within said first opening and a second solder structure within said second opening.

The present invention provides an electrical structure, comprising:

a substrate comprising a first electrically conductive pad and a second electrically conductive pad formed within a volumetric portion of the substrate;

a first dielectric layer over a surface of said substrate, a surface of said first electrically conductive pad, and a surface of said second electrically conductive pad;

a first via and a second via in said first dielectric layer, said first via located over a portion of said surface of said first electrically conductive pad, said second via located over a portion of said surface of said second electrically conductive pad;

a metallic layer over a surface of said first dielectric layer and within said first via and said second via;

a second dielectric layer over a surface of said metallic layer, said second dielectric layer comprising a first portion removed from over and within said first via, a second portion removed from over and within said second via, and a third portion removed from between said first via and said second via;

a ball limiting metallization layer formed within said first via and said second via, over a section of said surface of said metallic layer, and over a surface of said second dielectric layer;

a first solder ball formed within and over said first via and extending laterally from said first via over and parallel to a first portion of a surface of said ball limiting metallization layer; and a second solder ball formed within and over said second via and extending laterally from said second via over and parallel to a second portion of said surface of said ball limiting metallization layer.

The present invention advantageously provides a system and associated method for providing a structurally adequate connection means for connecting an electrical structure to another electrical structure.

DETAILED DESCRIPTION OF THE INVENTION

FIGS. 1-12 illustrate and describe stages in a fabrication process of an electrical (interconnection) structure 2, in accordance with embodiments of the present invention. The electrical structure 2 illustrated in FIGS. 1-12 is a cross sectional view. The electrical structure 2 may comprise any electrical structure known to a person of ordinary skill in the art including, inter alia, a semiconductor device, etc. The fabrication process described with respect to FIGS. 1-12 comprises the formation of a connecting means (e.g., see solder balls 29a and 29b in FIG. 12) for electrically and mechanically connecting the electrical structure 2 to another electrical structure (not shown). The fabricated electrical structure 2 illustrated in FIG. 12 may comprise, inter alia, a copper back end of the line controlled collapse chip connection (CuBEOL C4) electrical structure.

Figure 1:
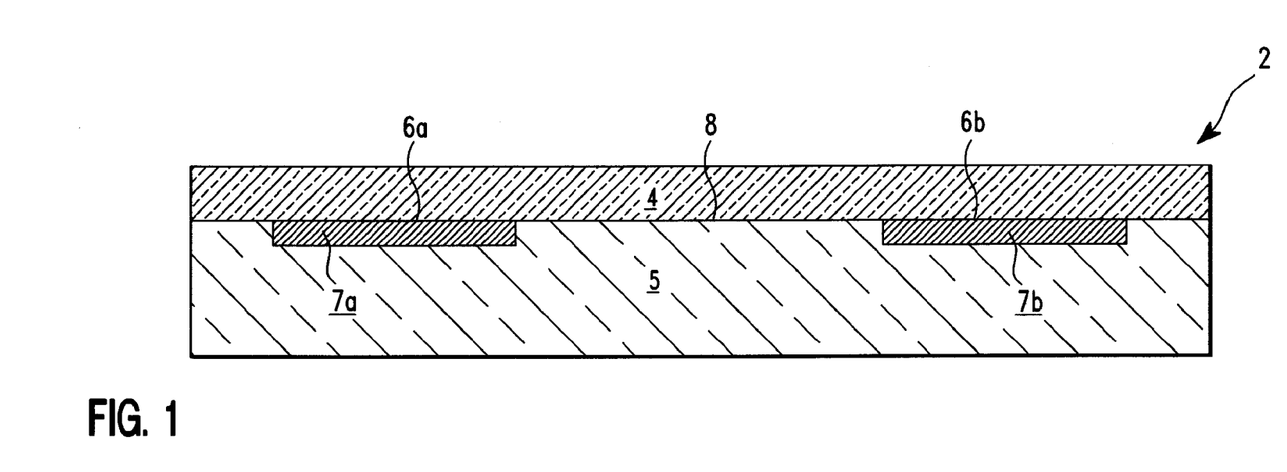
FIG. 1 illustrates a cross sectional view of an electrical structure comprising a dielectric layer over a substrate, in accordance with embodiments of the present invention.

In FIG. 1, the electrical structure 2 is provided for the fabrication process, in accordance with embodiments of the present invention. The electrical structure 2 comprises a substrate 5 with conductive pads 7a and 7b formed within the substrate 5 and a dielectric layer 4 formed over the substrate 5. The substrate 5 may comprise any type of dielectric material used for insulating a semiconductor device known to a person of ordinary skill in the art including, inter alia, a silicon dioxide substrate, a fluorinated silicon dioxide substrate, a silicon glass substrate, etc. The conductive pads 7a and 7b may comprise any type of conductive pads known to a person of ordinary skill in the art including, inter alia, copper pads, etc. The conductive pads 7a and 7b may be formed within the substrate 5 using any conductive pad forming process known to a person of ordinary skill in the art including, inter alia, a damascene process. A surface 6a of the conductive pad 7a, a surface 6b of the conductive pad 7b, and a surface 8 of the substrate 5 may be substantially coplanar. Note that although the dielectric layer 4 illustrated in FIGS. 1-12 only comprises one dielectric layer, the dielectric layer 4 may comprise a plurality of dielectric layers. The dielectric layer 4 may comprise any dielectric insulating material including, inter alia, oxide, nitride, or any combination thereof. The dielectric layer 4 may be deposited on the substrate 5 using any technique known to a person of ordinary skill in the art including, inter alia, a chemical vapor deposition process, etc.

Figure 2:
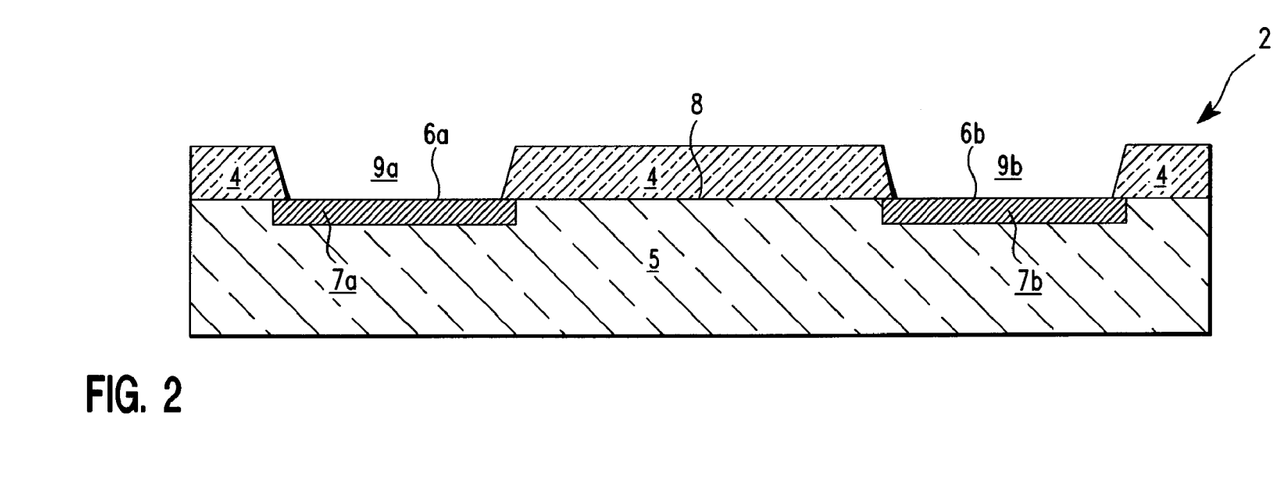
FIG. 2 illustrates a cross sectional view of the electrical structure of FIG. 1 after vias have been formed in the dielectric layer, in accordance with embodiments of the present invention.

FIG. 2 illustrates the electrical structure 2 of FIG. 1 after vias 9a and 9b have been formed, in accordance with embodiments of the present invention. Via 9a exposes conductive pad 7a for connection and via 9b exposes conductive pad 7b for connection. Vias 9a and 9b may be formed using any process known to a person of ordinary skill in the art including, inter alia, creating a via pattern using a standard photoresist process to create the pattern by photolithography and transferring the pattern to the dielectric layer 4 by a reactive ion etch process using a standard fluorine-containing RIE chemistry. Portions of the dielectric layer 4 are stripped away (to create vias 9a and 9b) using standard techniques known to a person of ordinary skill in the art.

Figure 3:
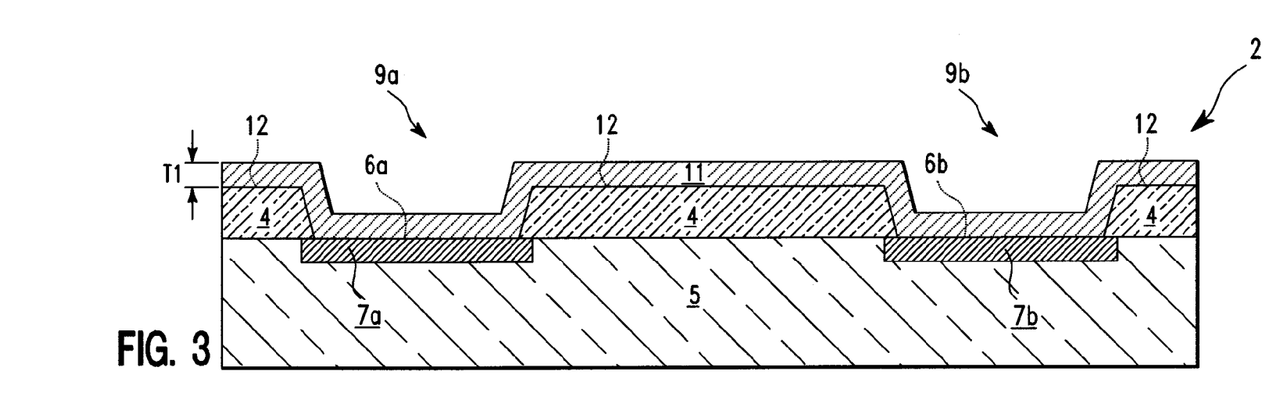
FIG. 3 illustrates a cross sectional view the electrical structure of FIG. 2 after a metallic layer has been formed over the dielectric layer, in accordance with embodiments of the present invention.

FIG. 3 illustrates the electrical structure 2 of FIG. 2 after a metallic layer 11 has been formed, in accordance with embodiments of the present invention. The metallic layer 11 is formed over a surface 12 of the dielectric layer 4 and within vias 9a and 9b. The metallic layer 11 in FIG. 3 is electrically connected to conductive pads 7a and 7b. The metallic layer 11 may comprise any metallic conducting material including, inter alia, tantalum, tantalum nitride, etc. The metallic layer 11 may comprise a thickness T1 of at least 250 angstroms. The metallic layer 11 may be deposited over surface 12 of the dielectric layer 4 and within vias 9a and 9b using any deposition technique known to a person of ordinary skill in the art including, inter alia, a physical vapor deposition technique, etc.

Figure 4:
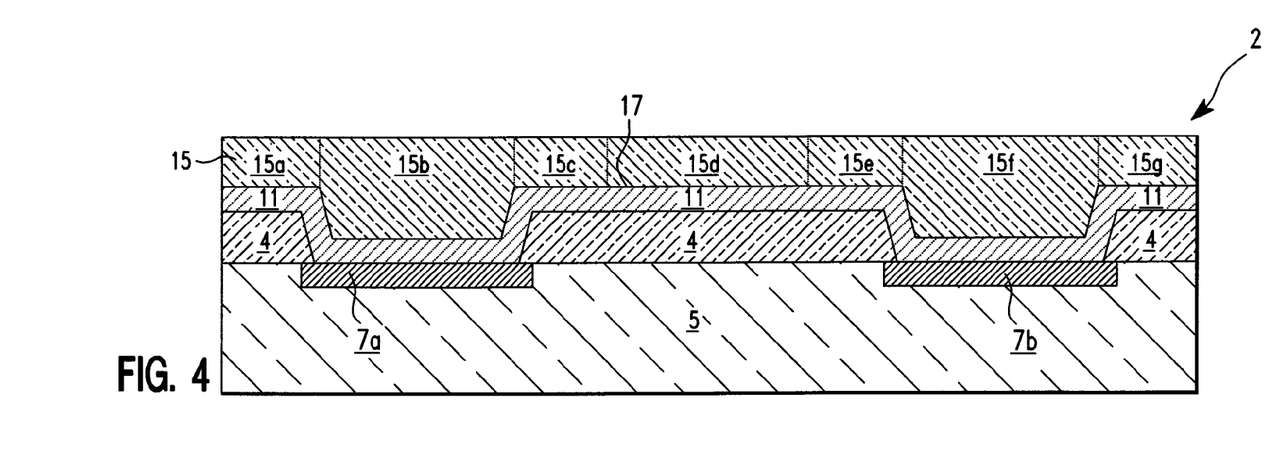
FIG. 4 illustrates a cross sectional view of the electrical structure of FIG. 3 after a dielectric layer has been formed over a surface of metallic layer, in accordance with embodiments of the present invention.

FIG. 4 illustrates the electrical structure 2 of FIG. 3 after a dielectric layer 15 has been formed over a surface 17 of metallic layer 11, in accordance with embodiments of the present invention. The dielectric layer 15 may comprise any dielectric material including, inter alia, a polyamide dielectric material (including a photo sensitive polyamide dielectric material), an organic dielectric material, etc. The dielectric layer 15 may be formed over a surface 17 of metallic layer 11 using any process known to a person of ordinary skill in the art including, inter alia, a standard spin-apply process, etc. The dielectric layer 15 is patterned into sections 15a ... 15g. The sections 15a ... 15g may be patterned using any photolithographic process known to a person of ordinary skill in the art.

Figure 5:
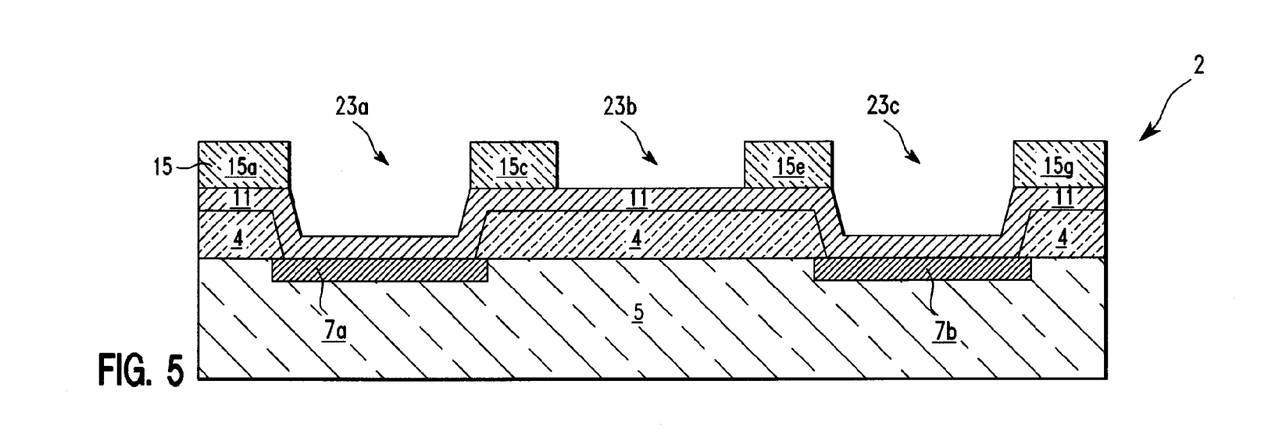
FIG. 5 illustrates a cross sectional view of the electrical structure of FIG. 4 after sections of the dielectric layer have been removed, in accordance with embodiments of the present invention.

FIG. 5 illustrates the electrical structure 2 of FIG. 4 after removed sections 15b, 15d, and 15f of the dielectric layer 15 have been removed, in accordance with embodiments of the present invention. The removed sections 15b, 15d, and 15f of the dielectric layer 15 of FIG. 4 create openings 23a ... 23c in FIG. 5. The sections 15b, 15d, and 15f of the dielectric layer 15 may be patterned and removed using any means know to a person of ordinary skill in the art. For example, if the dielectric layer 15 comprises a negative acting photosensitive polyamide material, then sections 15a, 15c, 15e, and 15g of FIG. 4 are exposed to a light source and all sections 15a ... 15g are exposed to a developer solution. Sections 15a, 15c, 15e, and 15g remain after exposure to the light source and developer solution and sections 15b, 15d, and 15g (i.e., not exposed to the light source) are removed after exposure to the developer solution thereby creating openings 23a, 23b, and 23c.

Figure 6:
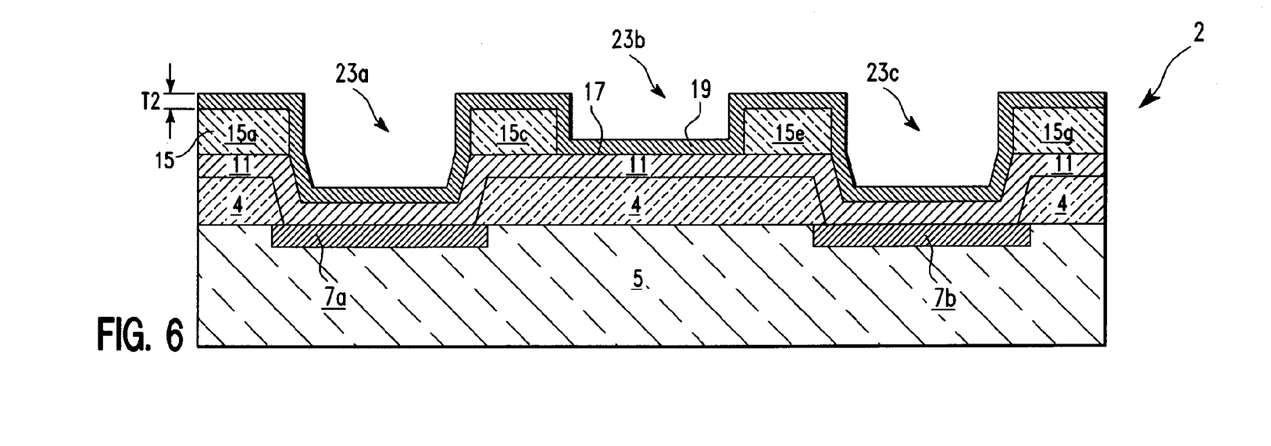
FIG. 6 illustrates a cross sectional view of the electrical structure of FIG. 5 after a ball limiting metallization (BLM) layer has been formed over the surface of metallic layer and over sections of the dielectric layer, in accordance with embodiments of the present invention.

FIG. 6 illustrates the electrical structure 2 of FIG. 5 after a ball limiting metallization layer 19 (BLM) has been formed over surface 17 of metallic layer 11 and over sections 15a, 15c, 15e, and 15g of the dielectric layer 15, in accordance with embodiments of the present invention. The BLM layer 19 is formed over a portion of surface 17 that has been exposed in openings 23a, 23b, and 23c. The BLM layer 19 may comprise a thickness T2 of about 0.5 um to about 3 um.

Note that although the BLM layer 19 illustrated in FIGS. 6-12 only comprises one the layer, the BLM layer 19 may comprise a plurality of layers. BLM layer 19 may comprise any conductive material(s) including, inter alia, TiW, CrCu, Cu, or any combination thereof. BLM layer 19 may be formed using any process known to a person of ordinary skill in the art including, inter alia, a physical vapor deposition technique, a plating process, etc.

Figure 7:
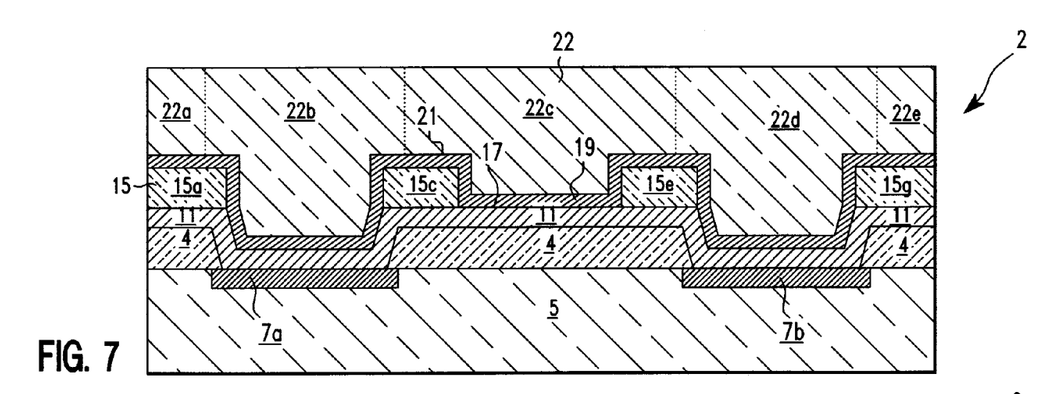
FIG. 7 illustrates a cross sectional view of the electrical structure of FIG. 6 after a photoresist layer has been formed over a surface of the BLM layer, in accordance with embodiments of the present invention.

FIG. 7 illustrates the electrical structure 2 of FIG. 6 after photoresist layer 22 has been formed over surface 21 of the BLM layer 19, in accordance with embodiments of the present invention. The photoresist layer 22 may comprise an organic photoresist layer. The photoresist layer 22 is patterned into sections 22a . . . 22e. The sections 22a . . . 22e may be patterned using any photolithographic process known to a person of ordinary skill in the art.

Figure 8:
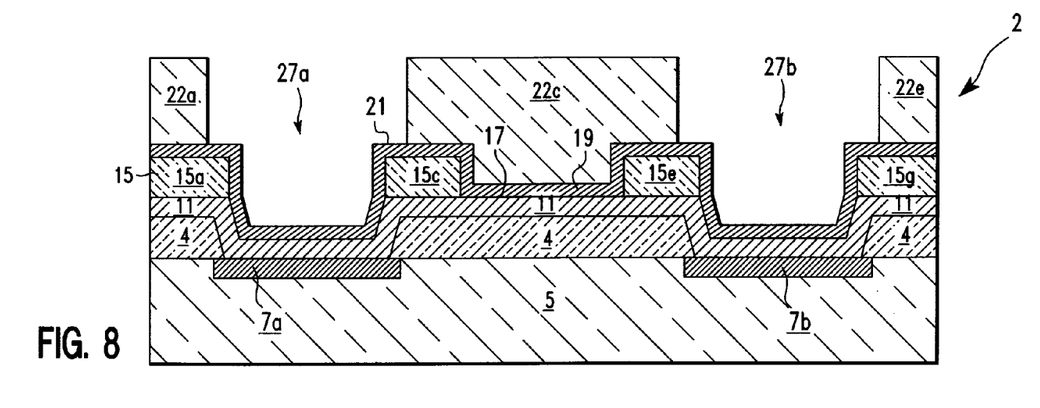
FIG. 8 illustrates a cross sectional view of the electrical structure of FIG. 7 after a first group of sections of the photoresist layer have been removed, in accordance with embodiments of the present invention.

FIG. 8 illustrates the electrical structure 2 of FIG. 7 after sections 22b and 22d of the photoresist layer 22 have been removed, in accordance with embodiments of the present invention. The removed sections 22b and 22d of the photoresist layer 22 of FIG. 7 creates openings 27a and 27b in FIG. 8. The section 22b and 22d of the photoresist layer 22 may be removed using any photolithographic process know to a person of ordinary skill in the art.

Figure 9:
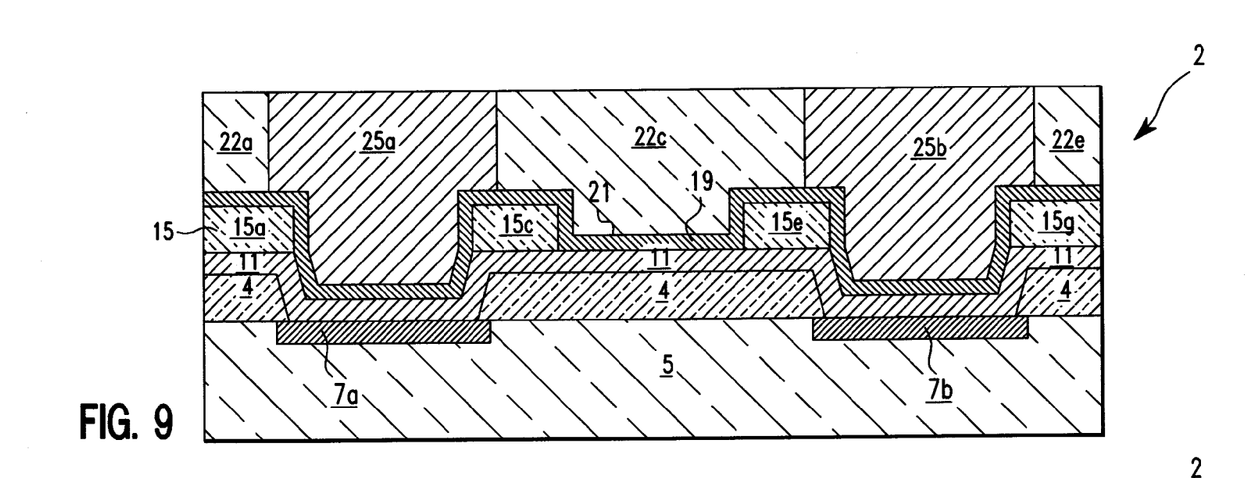
FIG. 9 illustrates a cross sectional view of the electrical structure of FIG. 8 after solder structures have been formed within openings in the photoresist layer, in accordance with embodiments of the present invention.

FIG. 9 illustrates the electrical structure 2 of FIG. 8 after solder structures 25a and 25b have been formed within openings 27a and 27b respectively, in accordance with embodiments of the present invention. The solder structure 25a is electrically connected to the BLM layer 19 and ultimately to conducive pad 7a. The solder structure 25b is electrically connected to the BLM layer 19 and ultimately to conducive pad 7b. The solder structures 25a and 25b may be formed using any solder structure forming process know to a person of ordinary skill in the art including, inter alia, an electroplating process, etc. The solder structures 25a and 25b may comprise any solder material composition including, inter alia, a lead/tin composition, a lead free composition (e.g., a tin/copper composition, a tin/silver composition, etc.), etc.

Figure 10:
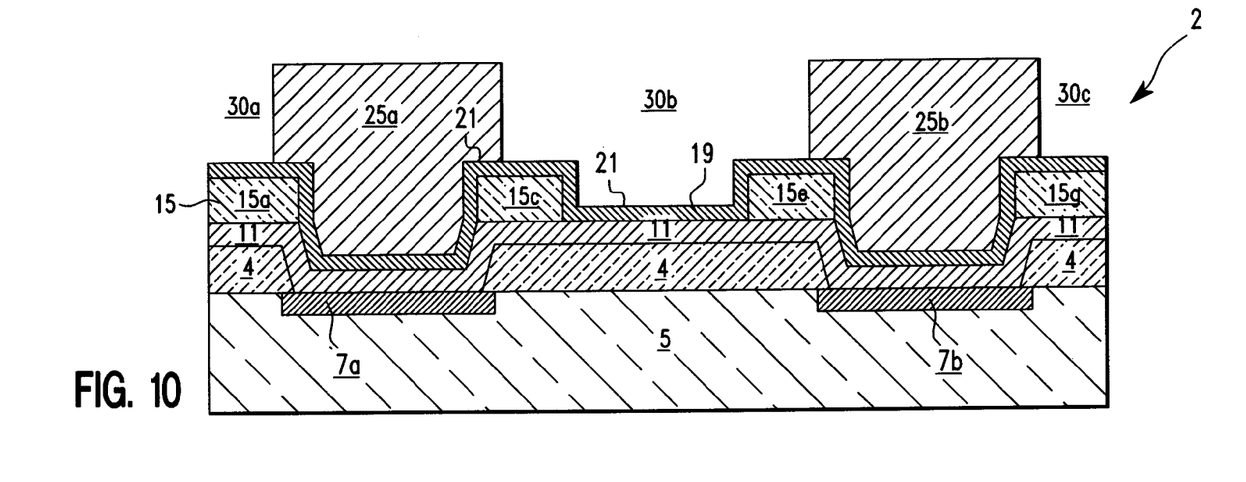
FIG. 10 illustrates a cross sectional view of the electrical structure 2 of FIG. 9 after a second group of sections of the photoresist layer have been removed, in accordance with embodiments of the present invention.

FIG. 10 illustrates the electrical structure 2 of FIG. 9 after sections 22a, 22c, and 22e have been removed, in accordance with embodiments of the present invention. The removed sections 22a, 22c, and 22e from FIG. 9 creates openings 30a, 30b, and 30c respectively in FIG. 10. The sections 22a, 22c, and 22e may be removed using, inter alia, a standard wet chemistry etch, etc.

Figure 11:
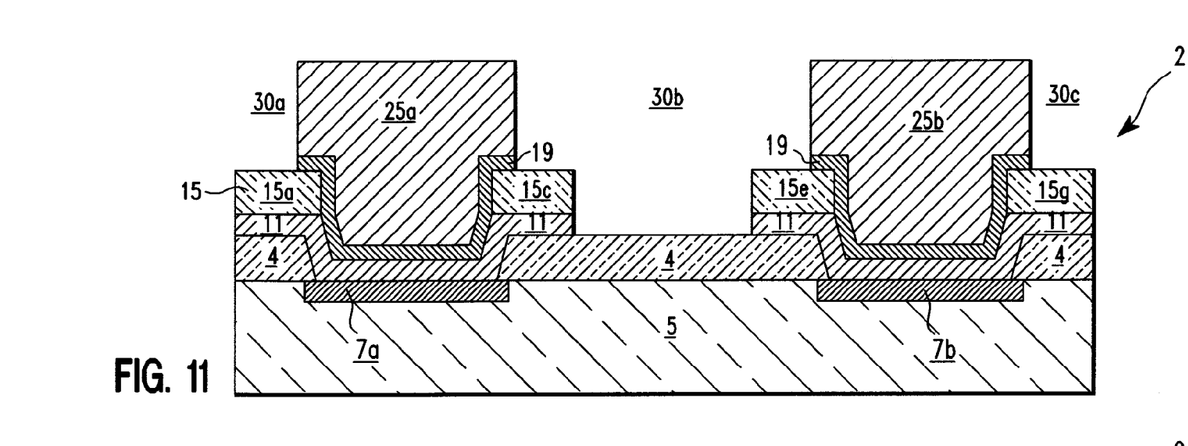
FIG. 11 illustrates a cross sectional view of the electrical structure of FIG. 10 after sections of the BLM layer and sections of the metallic layer have been removed, in accordance with embodiments of the present invention.

FIG. 11 illustrates the electrical structure 2 of FIG. 10 after sections of the BLM layer 19 and sections of the metallic layer 11 have been removed, in accordance with embodiments of the present invention. Sections of the BLM layer 19 within openings 30a, 30b, and 30c have been removed. Sections of the metallic layer 11 within openings 30a, 30b, and 30c have been removed. Any etching process may be used to remove the sections of the BLM layer 19 within openings 30a, 30b, and 30c including, inter alia, a wet etch process, a reactive ion etch process, etc. Any etching process may be used to remove the sections of the metallic layer 11 within openings 30a, 30b, and 30c including, inter alia, an industry standard dry reactive ion etch process containing fluorine. Removing the sections of the BLM layer 19 and the sections of the metallic layer 11 within opening 30b electrically separates the solder structures 25a and 25b from each other.

Figure 12:
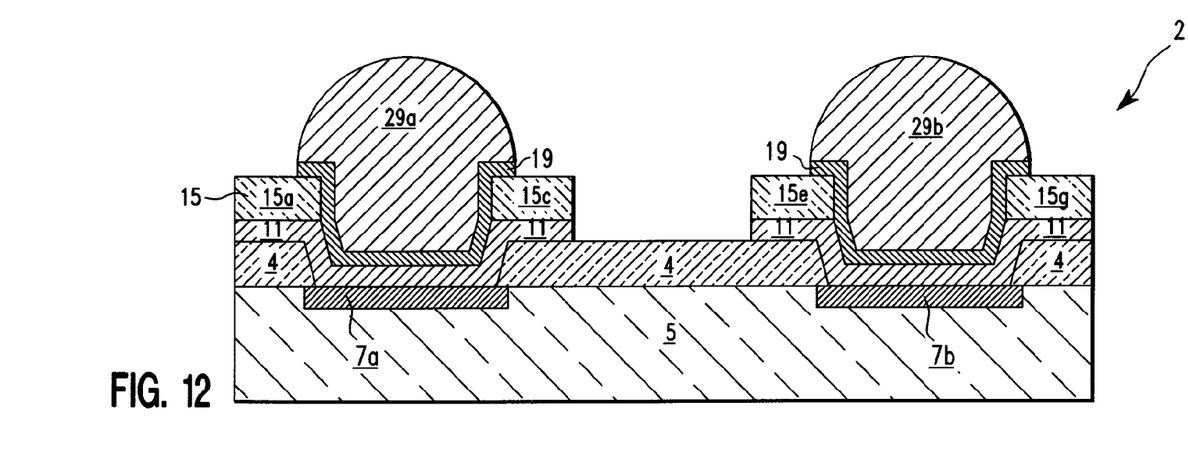
FIG. 12 illustrates a cross sectional view of the electrical structure of FIG. 11 after solder balls have been formed, in accordance with embodiments of the present invention.

FIG. 12 illustrates the electrical structure 2 of FIG. 11 after solder balls 29a and 29b have been formed, in accordance with embodiments of the present invention. Solder ball 29a is formed from solder structure 25a and solder ball 29b is formed from solder structure 25b. The solder structures 25a and 25b are treated in a high temperature (e.g., 150 C-380 C) reflow furnace to generate the solder balls 29a and 29b. The solder balls 29a and 29b may be cleaned with an industry standard cleaning process such as, inter alia, using a dilute acid rinse to remove surface oxides from the solder balls 29a and 29b. The electrical structure 2 of FIG. 12 is ready for electrically and mechanically connecting to another electrical structure (not shown).

Figure 13:
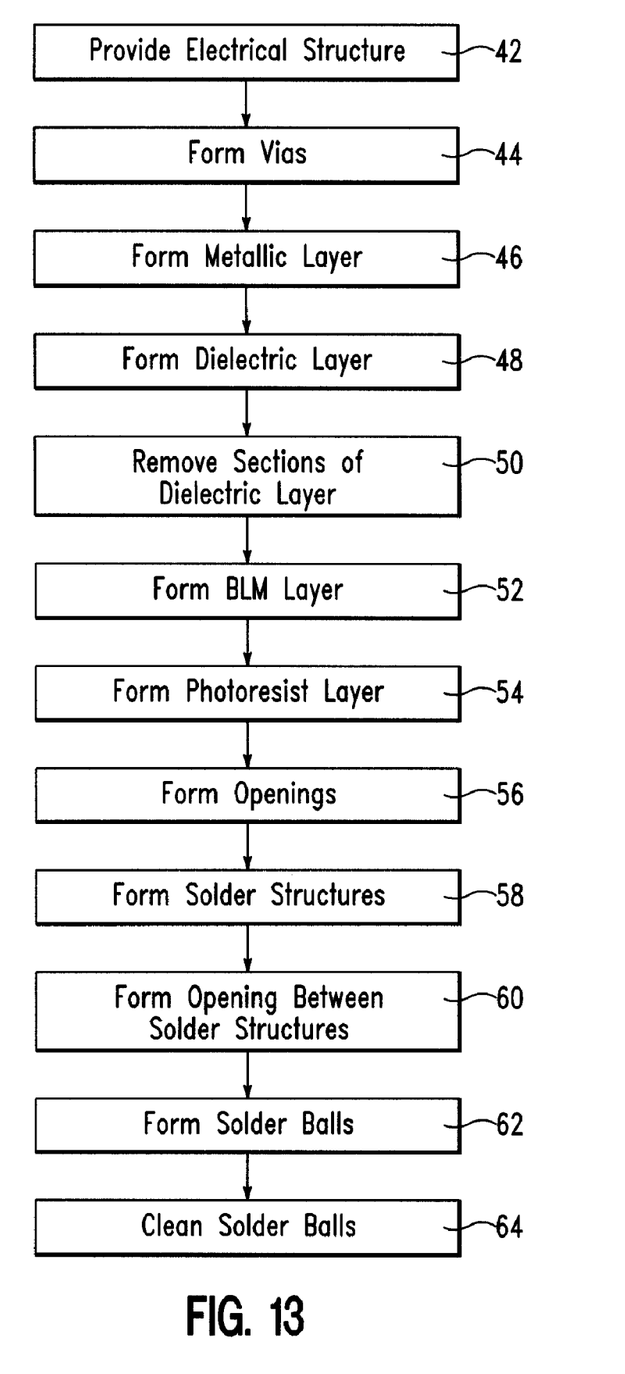
FIG. 13 is a flowchart illustrating an algorithm describing the process for forming the electrical structure of FIGS. 1-12, in accordance with embodiments of the present invention.

FIG. 13 is a flowchart a process for forming the electrical structure 2 of FIGS. 1-12, in accordance with embodiments of the present invention. In step 42, an electrical structure 2 is provided for a fabrication process. The electrical structure 2 comprises a substrate 5 with conductive pads 7a and 7b formed within the substrate 5 and a dielectric layer 4 formed over the substrate 5. In step 44, the vias 9a and 9b are formed within the dielectric layer 4. In step 46, the metallic layer 11 is formed over surface 12 of the dielectric layer 4 and within vias 9a and 9b. In step 48, dielectric layer 15 is formed over surface 17 of the metallic layer 11. In step 50, sections 15b, 15d, and 15f of the dielectric layer are removed thereby creating openings 23a . . . 23c. In step 52, the BLM layer 19 is formed over surface 17 of metallic layer 11 and over sections 15a, 15c, 15e, and 15g of the dielectric layer 15. In step 54, photoresist layer 22 is formed over surface 21 of the BLM layer 19. In step 56, sections 22b and 22d of the photoresist layer 22 are removed. The removed sections 22b and 22d of the photoresist layer 22 form openings 27a and 27b. In step 58, solder structures 25a and 25b are formed within openings 27a and 27b respectively. In step 60, sections 22a, 22c, and 22e of the photoresist layer 22 are removed. The removed sections 22a, 22c, and 22e form openings 30a, 30b, and 30c respectively. In step 62, solder balls 29a and 29b are formed. In step 64, solder balls 29a and 29b are cleaned to remove surface oxides.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method for forming an electrical structure, comprising:

providing a substrate comprising a first electrically conductive pad and a second electrically conductive pad formed within a volumetric portion of the substrate and a first dielectric layer over a surface of said substrate, a surface of said first electrically conductive pad, and a surface of said second electrically conductive pad;

forming a first via and a second via in said first dielectric layer, said first via located over a portion of said surface of said first electrically conductive pad, said second via located over a portion of said surface of said second electrically conductive pad;

forming a metallic layer over a surface of said first dielectric layer and within said first via and said second via;

forming a second dielectric layer over a surface of said metallic layer;

removing a first portion, a second portion, and a third portion of said second dielectric layer, said first portion removed from over and within said first via, said second portion removed from over and within said second via, and said third portion removed from between said first via and said second via;

forming a ball limiting metallization layer within said first via and said second via, over a portion of said surface of said metallic layer, and over a surface of said second dielectric layer that remains after said removing said first portion, said second portion, and said third portion of said second dielectric layer;

forming a photoresist layer over a surface of said ball limiting metallization layer;

forming a first opening in said photoresist layer by removing a first portion of said photoresist layer located within and over said first via and extending laterally over and parallel to a portion of said surface of said ball limiting metallization layer;

forming a second opening in said photoresist layer by removing a second portion of said photoresist layer located within and over said second via and extending laterally over and parallel to a portion of said surface of said ball limiting metallization layer; and forming a first solder structure within said first opening and a second solder structure within said second opening.

2. The method of claim 1, further comprising:

forming a third opening between said first solder structure and said second solder structure by removing a third portion of said photoresist layer located between said first solder structure and said second solder structure, a portion of said ball limiting metallization layer located between said first solder structure and said second solder structure, and a portion of said metallic layer located between said first solder structure and said second solder structure.

3. The method of claim 1, further comprising:

reflowing said first solder structure to form a first solder ball; and reflowing said second solder structure to form a second solder ball.

4. The method of claim 3, further comprising cleaning a surface of said first solder ball and a surface of said second solder ball.

5. The method of claim 1, wherein said first dielectric layer comprises more than one layer of dielectric material.

6. The method of claim 1, wherein said metallic layer comprises a material selected from the group consisting of tantalum and tantalum nitride.

7. The method of claim 1, wherein said forming metallic layer comprises using a physical vapor deposition process.

8. The method of claim 1, wherein said second dielectric layer comprises a polyamide layer.

9. The method of claim 1, wherein said metallic layer comprises a thickness of at least 250 angstroms.

10. The method of claim 1, wherein said first dielectric layer and said second dielectric layer each comprise a different dielectric material.

11. The method of claim 1, wherein each of said first solder structure and said second solder structure comprises a substantially lead free solder composition.

* * * * *